(12) United States Patent
Van Houdt

(10) Patent No.: US 12,376,296 B2
(45) Date of Patent: Jul. 29, 2025

(54) MEMORY STRUCTURES AND METHODS OF PROCESSING THE SAME

(71) Applicant: IMEC vzw, Leuven (BE)

(72) Inventor: Jan Van Houdt, Bekkevoort (BE)

(73) Assignee: IMEC vzw, Leuven (BE)

( * ) Notice: Subject to any disclaimer, the term of this patent is extended or adjusted under 35 U.S.C. 154(b) by 372 days.

(21) Appl. No.: 17/714,895

(22) Filed: Apr. 6, 2022

(65) Prior Publication Data

US 2022/0328510 A1 Oct. 13, 2022

(30) Foreign Application Priority Data

Apr. 7, 2021 (EP) ..................................... 21167143

(51) Int. Cl.
*H10B 51/00* (2023.01)
*H10B 41/27* (2023.01)
(Continued)

(52) U.S. Cl.
CPC ............ *H10B 41/35* (2023.02); *H10B 41/27* (2023.02); *H10B 43/27* (2023.02); *H10B 43/35* (2023.02);
(Continued)

(58) Field of Classification Search
CPC ........ H10B 51/20; H10B 51/30; H10B 43/27; H10B 43/35
See application file for complete search history.

(56) References Cited

U.S. PATENT DOCUMENTS

2016/0181259 A1\* 6/2016 Van Houdt ............ H10B 51/30
257/295
2016/0284722 A1\* 9/2016 Lai ..................... H01L 29/66833
(Continued)

FOREIGN PATENT DOCUMENTS

CN 111799263 A 10/2020
CN 111799264 A 10/2020
(Continued)

OTHER PUBLICATIONS

Extended European Search Report dated Sep. 29, 2021 in European Application No. 21167143.3 in 8 pages.
(Continued)

*Primary Examiner* — Reema Patel
(74) *Attorney, Agent, or Firm* — Knobbe, Martens, Olson & Bear, LLP

(57) ABSTRACT

The disclosed technology generally relates to memory structures, for example for a vertical NAND memory. In one aspect, a memory structure includes a substrate and a layer stack arranged on a surface of the substrate, wherein the layer stack includes one or more conductive material layers alternating with one or more dielectric material layers. The memory structure can also include a trench in the layer stack, wherein the trench is formed through the one or more conductive material layers, and wherein the trench includes inner side walls. The memory structure also includes a programmable material layer arranged in the trench and which covers the inner side walls of the trench. The memory structure further includes an oxide semiconductor layer arranged in the trench over the programmable material layer.

15 Claims, 5 Drawing Sheets

(51) Int. Cl.
*H10B 41/35* (2023.01)
*H10B 43/27* (2023.01)
*H10B 43/35* (2023.01)
*H10B 51/20* (2023.01)
*H10B 51/30* (2023.01)
*H10D 30/01* (2025.01)
*H10D 30/69* (2025.01)

(52) U.S. Cl.
CPC ............. *H10B 51/20* (2023.02); *H10B 51/30* (2023.02); *H10D 30/0415* (2025.01); *H10D 30/701* (2025.01)

(56) References Cited

U.S. PATENT DOCUMENTS

| | | |
|---|---|---|
| 2018/0182851 A1 | 6/2018 | Van Houdt |
| 2021/0043654 A1 | 2/2021 | Yoo et al. |
| 2021/0375937 A1* | 12/2021 | Wu .................. H10B 51/10 |

FOREIGN PATENT DOCUMENTS

| | | |
|---|---|---|
| EP | 3 038 141 A1 | 6/2016 |
| WO | WO 2018/236353 A1 | 12/2018 |
| WO | WO 2020/204314 A1 | 10/2020 |
| WO | WO 2021/024598 A1 | 2/2021 |

OTHER PUBLICATIONS

Mo et al., "Low-Voltage Operating Ferroelectric FET with Ultrathin IGZO Channel for High-Density Memory Application," Journal of the Electron Devices Society, vol. 8, 2020, pp. 717-723.

* cited by examiner

MEMORY STRUCTURES AND METHODS OF PROCESSING THE SAME

CROSS-REFERENCE TO RELATED APPLICATIONS

This application claims foreign priority to European Patent Application No. EP 21167143.3, filed Apr. 7, 2021, the content of which is incorporated by reference herein in its entirety.

BACKGROUND

Technical Field

The disclosed technology generally relates to memory structures for a nonvolatile memory such as for a vertical memory. The disclosed technology also generally relates to methods of processing such memory structures. The memory structures may include one or more vertical ferroelectric transistor structures.

Description of the Related Technology

A flash memory is a type of non-volatile memory that can be electrically programmed and erased. A NAND flash is a special type of flash memory, where the individual memory cells can be connected in series in the form of a NAND gate. A NAND flash with a three-dimensional architecture, e.g., a NAND flash with memory cells that are arranged vertically, can be generally referred to as 3D NAND or vertical NAND.

SUMMARY OF CERTAIN INVENTIVE ASPECTS

An objective of the disclosed technology is to provide improved memory structures and improved methods of processing a memory structure.

The objective can be achieved by various embodiments provided in the enclosed independent claims. Advantageous implementations of the embodiments of the disclosed technology are further defined in the dependent claims.

According to a first aspect, the disclosed technology relates to a memory structure, comprising a substrate; a layer stack which is arranged on a surface of the substrate, wherein the layer stack comprises one or more conductive material layers alternating with one or more dielectric material layers; a trench in the layer stack, wherein the trench is formed through (e.g., penetrates or completely penetrates) the one or more conductive material layers, and wherein the trench comprises inner side walls; a programmable material layer which is arranged in the trench and which covers the inner side walls of the trench; and an oxide semiconductor layer which is arranged in the trench over (e.g., on top of) the programmable material layer.

Various implementations can achieve the advantage that a 3D memory structure with an oxide semiconductor channel can be formed. The use of the oxide semiconductor as channel material can lead to several advantages, especially when compared to a polysilicon channel. For example, the formation of an oxide interface layer between the programmable material and the channel can be largely avoided in various implementations, mainly because no high temperature crystallization steps need to be performed after channel deposition. This interface layer can cause voltage loss and charge trapping, thus reducing the endurance of the device. Further, the oxide semiconductor channel can exhibit higher electron mobility compared to a polysilicon channel, which allows for larger read currents.

The memory structure can comprise one or more field-effect transistors (FETs), for example ferroelectric field-effect transistors (FeFETs), wherein the oxide semiconductor layer can form a channel of the FET, and wherein the memory structure can comprise source and drain structures. For example, the source and drain structures can be arranged on a top respectively bottom side of the trench. Alternatively, the source and drain structures can both be arranged on the layer stack on opposite sides of the trench.

The substrate can be a silicon substrate, for instance a silicon wafer or a part thereof.

The layer stack may comprise more than two conductive materials stacked along a determined direction perpendicular to the surface of the substrate, wherein a dielectric material layer can be arranged between subsequent conductive material layers.

The conductive material layers can be formed from a semiconductor material, such as silicon, e.g., polysilicon, or silicon germanium. The semiconductor material can be n- or p-doped to enhance the conductivity. In some instances, the conductive material layers form word lines of the memory structure.

The dielectric material layers can be formed from a dielectric or insulating material, such as silicon oxide or silicon nitride.

In some instances, the trench extends along an extension direction along the horizontal surface of the substrate. The inner side walls of the trench can be sloped.

The trench can be formed through (e.g., penetrate or completely penetrate) the layer stack (e.g., the entire layer stack). Further, the trench can be formed at least partially within (e.g., at least partially penetrate) the substrate.

In an embodiment, the oxide semiconductor layer comprises any one or more of the following materials: indium gallium zinc oxide (IGZO), indium tin oxide (ITO), or indium zinc oxide (IZO). Various implementations can achieve the advantage that the channel is formed from a material with high electron mobility, thus allowing for larger read currents.

In an embodiment, the programmable material layer comprises a ferroelectric material. In some examples, the memory structure comprises one or more vertical FeFET structures.

In an embodiment, the ferroelectric material is a hafnium-based material, or a perovskite material, or a wurtzite material.

For example, the hafnium based ferroelectric material can be any one or more of hafnium dioxide ($HfO_2$), $HfZrO_4$, or doped $HfZrO_4$ (usually abbreviated as HZO). The perovskite material can be $BaTiO_3$, BSrTiO, PbZrTi, SrBiTa, or BiFeO. The wurtzite material can be aluminum nitride (AlN), where part of the aluminum can be replaced by, e.g., scandium (Sc).

In an embodiment, the trench is V-shaped and has a trapezoidal or triangular cross section.

In an embodiment, the oxide semiconductor layer fills up the trench. In some instances, this can achieve the advantage that no additional material layers need to be deposited on top of the oxide semiconductor layer, which reduces the complexity of the structure.

In some examples, due to the electrical properties of the oxide semiconductor layer, memory cells on both sides of the trench do not necessarily have to be separated by an additional filler material in the trench. Such a filler may be used, if a highly conductive material such as n+ polysilicon would be used instead of the oxide semiconductor material.

In an another embodiment, the oxide semiconductor layer forms a liner on the side walls of the trench, and a filling material, for example a dielectric, is arranged over (e.g., on top of) the oxide semiconductor layer in the trench.

In an embodiment, the memory structure can comprise a plurality of conductive lines which are arranged on the layer stack one after the other along the length of the trench, wherein each conductive line can extend perpendicular to an extension direction of the trench; wherein each conductive line can form a bit line of the memory structure; and wherein the oxide semiconductor layer in the trench can extend (e.g., uninterrupted) between at least two adjacent conductive lines. As used herein, reference to "each" of a particular element (e.g., "each conductive line") may refer to two or more of the elements, and may or may not refer to every one of the elements in the structure. For example, "each conductive line" may refer to individual ones of a plurality of conductive lines and not necessarily every single conductive line in the structure.

Various implementations can achieve the advantage that the processing complexity of the memory structure can be further reduced. In some examples, a structuring of the oxide semiconductor layer in the channel, e.g., via etching, can be omitted or simplified.

In various implementations, the lower conductivity of oxide semiconductor and that it can be only conductive in the vicinity of a (positive) voltage, can reduce and/or prevent short circuiting between different bit lines. Thus, no interruption of the oxide semiconductor layer between the individual bit lines may be required.

According to a second aspect, the disclosed technology relates to a flash memory, e.g., a three-dimensional NAND flash memory, comprising one or more memory structures according to the first aspect of the disclosed technology.

According to a third aspect, the disclosed technology relates to a method of processing a memory structure, comprising:
  providing a substrate;
  forming a layer stack on a surface of the substrate, wherein the layer stack comprises one or more conductive material layers alternating with one or more dielectric material layers;
  forming a trench in the layer stack, wherein the trench is formed through (e.g., penetrates or completely penetrates) the one or more conductive material layers, and wherein the trench comprises inner side walls;
  forming a programmable material layer in the trench, wherein the programmable material layer covers the inner side walls of the trench; and forming an oxide semiconductor layer in the trench over (e.g., on top of) the programmable material layer.

Various implementations can achieve the advantage that a 3D memory structure with an oxide semiconductor channel can be formed. The use of the oxide semiconductor as channel material can lead to several advantages, especially when compared to a polysilicon channel. For example, in some instances, the formation of an oxide interface layer between the programmable material and the channel can be largely avoided, mainly because no high temperature crystallization steps need to be performed after channel deposition. This interface layer can cause voltage loss and charge trapping, thus reducing the endurance of the device. Further, the oxide semiconductor channel can exhibit higher electron mobility compared to a polysilicon channel, which allows for larger read currents.

The substrate can be a silicon substrate, e.g., a silicon wafer.

The conductive material layers and the dielectric material layers can be deposited on the substrate with a suitable deposition technique, e.g., chemical vapor deposition (CVD), plasma enhanced chemical vapor deposition (PECVD), or molecular beam epitaxy (MBE).

The trench can be formed with an isotropic or anisotropic wet or dry etching technique.

The oxide semiconductor layer may comprise any one or more of the following materials: indium gallium zinc oxide (IGZO), indium tin oxide (ITO), or indium zinc oxide (IZO).

In an embodiment, the programmable material layer comprises a ferroelectric material, for example, a hafnium-based material, or a perovskite material, or a wurtzite material.

For example, the hafnium based ferroelectric material can be any one or more of hafnium dioxide ($HfO_2$), $HfZrO_4$, or doped $HfZrO_4$ (usually abbreviated as HZO). The perovskite material can be $BaTiO_3$, BSrTiO, PbZrTi, SrBiTa, or BiFeO. The wurtzite material can be aluminum nitride (AlN), where part of the aluminum Al can be replaced by, e.g., scandium (Sc).

In an embodiment, forming the programmable material layer comprises depositing the ferroelectric material in the trench.

The programmable material layer and/or the oxide semiconductor layer can be deposited in the trench with a suitable deposition technique, e.g., CVD, PECVD, or MBE.

In an embodiment, the oxide semiconductor layer fills up the trench.

In an another embodiment, the oxide semiconductor layer forms a liner on the side walls of the trench, wherein a filling material, for example a dielectric, is formed over (e.g., on top of) the oxide semiconductor layer in the trench.

In an embodiment, the method further comprises: forming a plurality of conductive lines which are arranged on the layer stack one after the other along the length of the trench, wherein each conductive line extends perpendicular to an extension direction of the trench; wherein each conductive line forms a bit line of the memory structure; and wherein the oxide semiconductor layer in the trench extends (e.g., uninterrupted) between at least two adjacent conductive lines.

BRIEF DESCRIPTION OF THE DRAWINGS

Embodiments of the disclosed technology will be explained in the followings together with the figures.

DETAILED DESCRIPTION OF CERTAIN ILLUSTRATIVE EMBODIMENTS

The channel of a 3D nonvolatile memory, e.g., 3D NAND memory, can be made out of a thin polysilicon layer that is doped to enhance the carrier mobility. The polysilicon layer can be deposited in the amorphous phase and, in a later step, crystallized by a high temperature anneal. The crystallization step can be performed, because the amorphous silicon typically has a very low carrier mobility of ca. 1 cm$^2$/Vs. Further, an additional thermal step can be performed to activate dopants in a drain junction of the NAND memory.

Ferroelectric field-effect transistors (FeFETs, or Ferro-FETs) can be used as memory cells in a NAND memory. A FeFET can store information based on permanent electrical polarization of a ferroelectric material, which can be arranged between a gate electrode and a source-drain conduction region of the FeFET. In a 3D NAND memory, the ferroelectric material can be arranged along a vertical direction with the polysilicon channel covering this ferroelectric material.

The high temperature annealing of the polysilicon channel can lead to the formation of a thin silicon dioxide (SiO$_2$) interfacial layer between the ferroelectric material and the silicon channel. The interface layer can be formed by scavenging oxygen from the ferroelectric material and binding the oxygen with the silicon channel. The interfacial layer can cause voltage loss and amplify charge trapping in the ferroelectric, which can limit the endurance of the memory.

Figure 1:
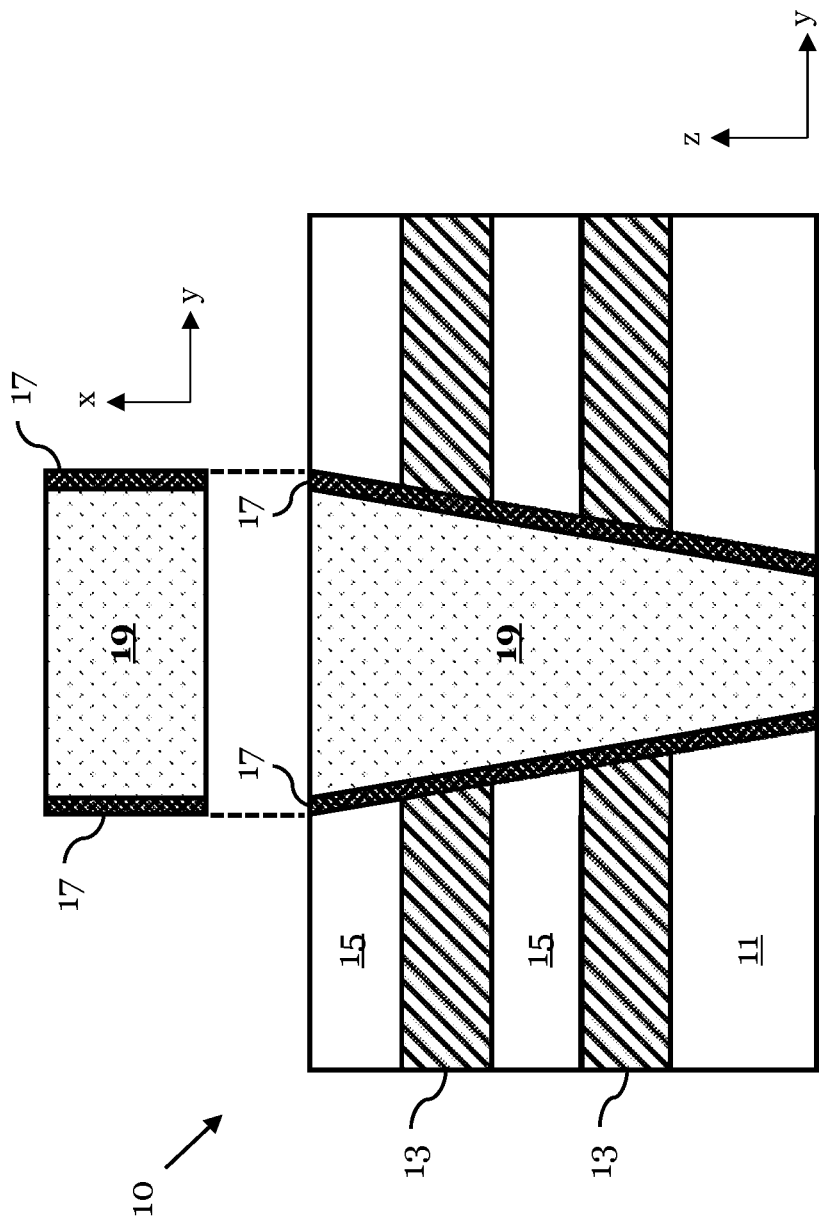
FIG. 1 shows a schematic diagram of an example memory structure according to an embodiment.

FIG. 1 shows a schematic diagram of an example memory structure 10 according to an embodiment.

In FIG. 1, the memory structure 10 comprises a substrate 11, a layer stack which is arranged on (e.g., over) a surface of the substrate 11, wherein the layer stack comprises one or more conductive material layers 13 alternating with one or more dielectric material layers 15. The memory structure 10 further comprises a trench in the layer stack, wherein the trench is formed through (e.g., penetrates or completely penetrates) the one or more conductive material layers 13, and wherein the trench comprises inner side walls. The memory structure 10, further, comprises a programmable material layer 17 which is arranged in the trench and which covers the inner side walls of the trench, and an oxide semiconductor layer 19 which is arranged in the trench over (e.g., on top of) the programmable material layer 17.

In particular, FIG. 1 shows a cross-sectional view of the example memory structure 10 along a y-z plane and a top view on a surface of the filled trench along an x-y plane.

The substrate 11 can be a silicon substrate, for instance a silicon wafer or a part thereof.

The layer stack may comprise any number of conductive material layers 13 stacked along a determined direction perpendicular to the surface of the substrate 11. In FIG. 1, the conductive material layers 13 are stacked along the z-direction perpendicular to the surface of the substrate 11, which extends along the x-y direction. A dielectric material layer 15 can be arranged between each subsequent conductive material layer 13. In some examples, the top layer of the layer stack is a conductive material layer 13. That is, the layer stack may comprise, arranged on one another and thus stacked along the determined, a conductive material layer 13 on the substrate 11, then a dielectric material layer 15, then another conductive material layer 13, then another dielectric material layer 15, and so on. The layer stack may also start with a dielectric material layer 15 on the substrate 11.

The conductive material layers 13 can be formed from a semiconductor material, such as silicon, e.g., polysilicon, or silicon germanium. The semiconductor material can be n- or p-doped to enhance the conductivity. In some examples, the conductive material layers can form word lines of the memory structure 10.

The dielectric material layers 15 can be formed from a dielectric or insulating material, such as silicon oxide or silicon nitride.

For example, the memory structure 10 may, further, comprise a number of conductive lines over (e.g., on top of) the layer stack (not shown in FIG. 1), which form bit lines of the memory structure 10.

The trench can be formed through (e.g., penetrate or completely penetrate) the layer stack (e.g., the entire layer stack). Further, the trench can be formed at least partially within (e.g., at least partially penetrate) the substrate 11, as shown in FIG. 1. The inner side walls of the trench can be sloped. For example, in FIG. 1, the trench is V-shaped and has a trapezoidal or triangular cross section. The top view of the filled trench in FIG. 1 shows that the trench extends along an extension direction along the horizontal surface of the substrate 11 (in FIG. 1 along the x-direction).

The programmable material layer 17 in the trench can comprise a ferroelectric material. This ferroelectric layer 17 can store information based on permanent electrical polarization.

For example, the ferroelectric material can include a hafnium-based material, or a perovskite material, or a wurtzite material. The hafnium based ferroelectric material can be any one of: hafnium dioxide (HfO$_2$), HfZrO$_4$, or doped HfZrO$_4$. The perovskite material can be BaTiO$_3$, BSrTiO, PbZrTi, SrBiTa, or BiFeO. The wurtzite material can be aluminum nitride (AlN), where part of the aluminum Al can be replaced by, e.g., scandium (Sc).

The memory structure 10 can comprise one or more FeFETs, wherein a section of the oxide semiconductor layer 19 forms a channel of the one or more FeFET. For example, the memory structure 10 can comprise at least one FeFET on one side of the trench and at least one further FeFET on the other side of the trench. Each FeFET can form a memory cell of the memory structure 10. The gate of each FeFET can be formed by the conductive material layers 13 of the layer stack on the respective side of the trench. For example, source and drain structures of the FeFETs can be arranged on a top respectively bottom side of the trench. Alternatively, source and drain structures can both be arranged on top of the layer stack on opposite sides of the trench.

The oxide semiconductor layer 19 can comprise any one or more of the following materials: indium gallium zinc oxide (IGZO), indium tin oxide (ITO), or indium zinc oxide (IZO).

By using this oxide semiconductor layer 19 as channel material instead of polysilicon, high temperature steps (for polysilicon crystallization) are no longer needed in various implementations when processing the structure 10. For example, Schottky junctions on the, e.g., IGZO channel can be made with a metal such as TiN. Further, the uniformity of the oxide semiconductor channel layer 19 can be enhanced, e.g., carrier mobilities in these amorphous or nanocrystalline layers can be as high as 40 cm$^2$/V·s.

In various instances, reducing the regrowth of the interfacial oxide can help to reduce charge trapping and, therefore, is beneficial for the endurance of the memory device 10. Further, using IGZO or another oxide semiconductor material as channel material, can in some implementations, provide a higher carrier mobility (compared to polysilicon) and, therefore, a larger read current of the memory device.

In the embodiment of the memory structure 10 shown in FIG. 1, the oxide semiconductor layer 19 fills up the trench.

In this example, a first memory cell is formed on the left side of the trench and a second memory cell on the right side of the trench, wherein sections of the oxide semiconductor layer 19 form respective channels for both of these memory cells. This can be possible, in various implementations, because the oxide semiconductor material, in contrast to n+ polysilicon, may be only conductive in the neighborhood of a (positive) voltage. Thus, there is reduced and/or no short circuit between both memory cells in various implementations.

The use of an oxide semiconductor as channel material can have further advantages. For example, the material can be formed at a much better uniformity compared to polysilicon in some examples. Also, since the oxide semiconductor material is amorphous (or nanocrystalline), it is not necessary to reduce the channel material volume to improve a channel current variability in some implementations. In some instances, filling up the trench with the oxide semiconductor layer 19 can, further, increase the current drive capabilities of the memory, and can lead to a simplified fabrication process, because no additional layer needs to be deposited in the trench.

Figure 2:
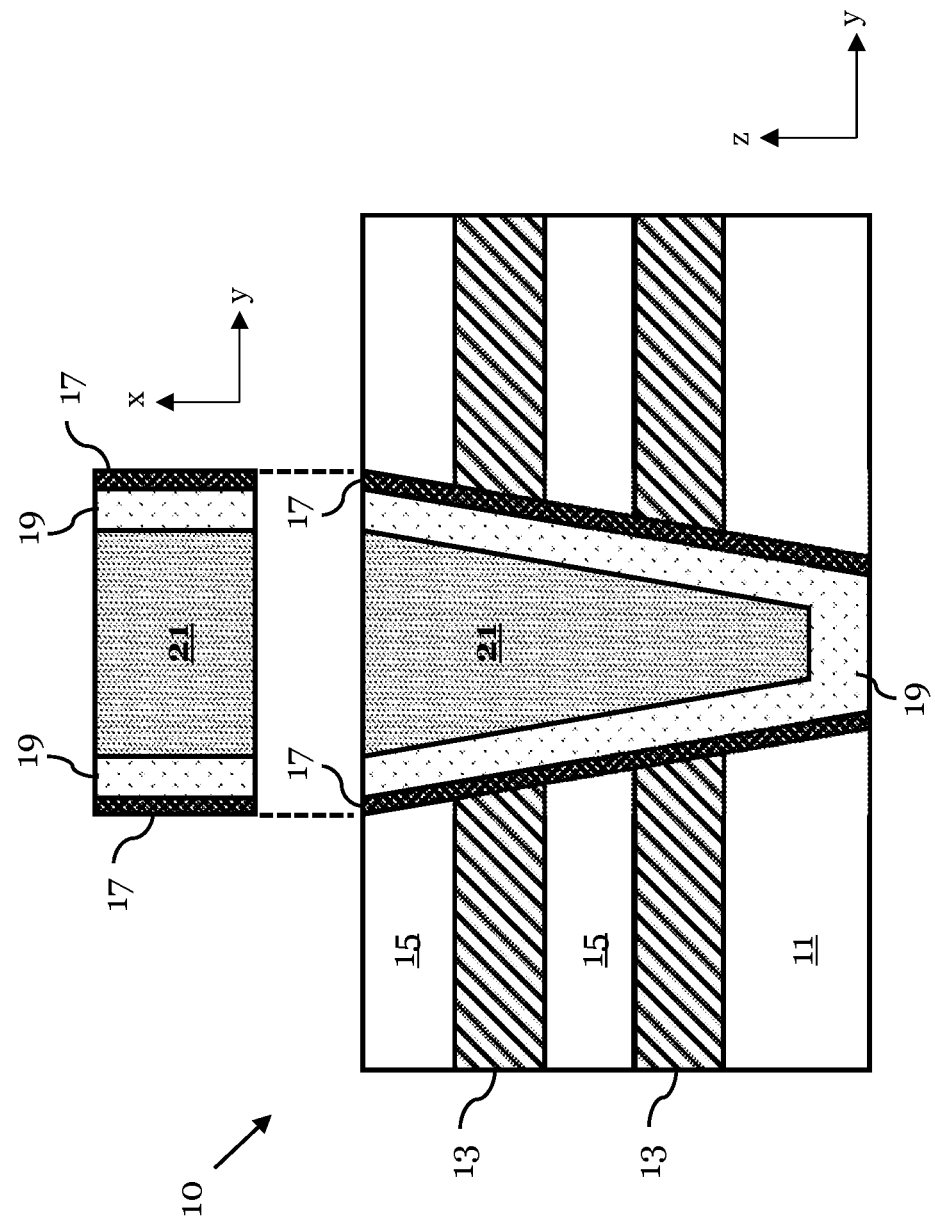
FIG. 2 shows a schematic diagram of an example memory structure according to an embodiment.

FIG. 2 shows a schematic diagram of the example memory structure 10 according to an alternative embodiment.

In FIG. 2, the oxide semiconductor layer 19 forms a liner on the side walls of the trench, and a filling material 21 is arranged over (e.g., on top of) the oxide semiconductor layer 19 in the trench. In some instances, the filling material 21 fills up the trench.

The filling material 21 can be a dielectric, e.g., an oxide such as silicon oxide.

By depositing the oxide semiconductor layer 19 in the form of a thin liner, the electrical properties of the channel can be further improved and/or optimized in various implementations. For example, the filler material 21 can provide additional electrical isolation between memory cells on both sides of the trench.

Besides the trench filling, the memory structure 10 shown in FIG. 2 can be similar to the memory structure 10 shown in FIG. 1.

Figure 3:
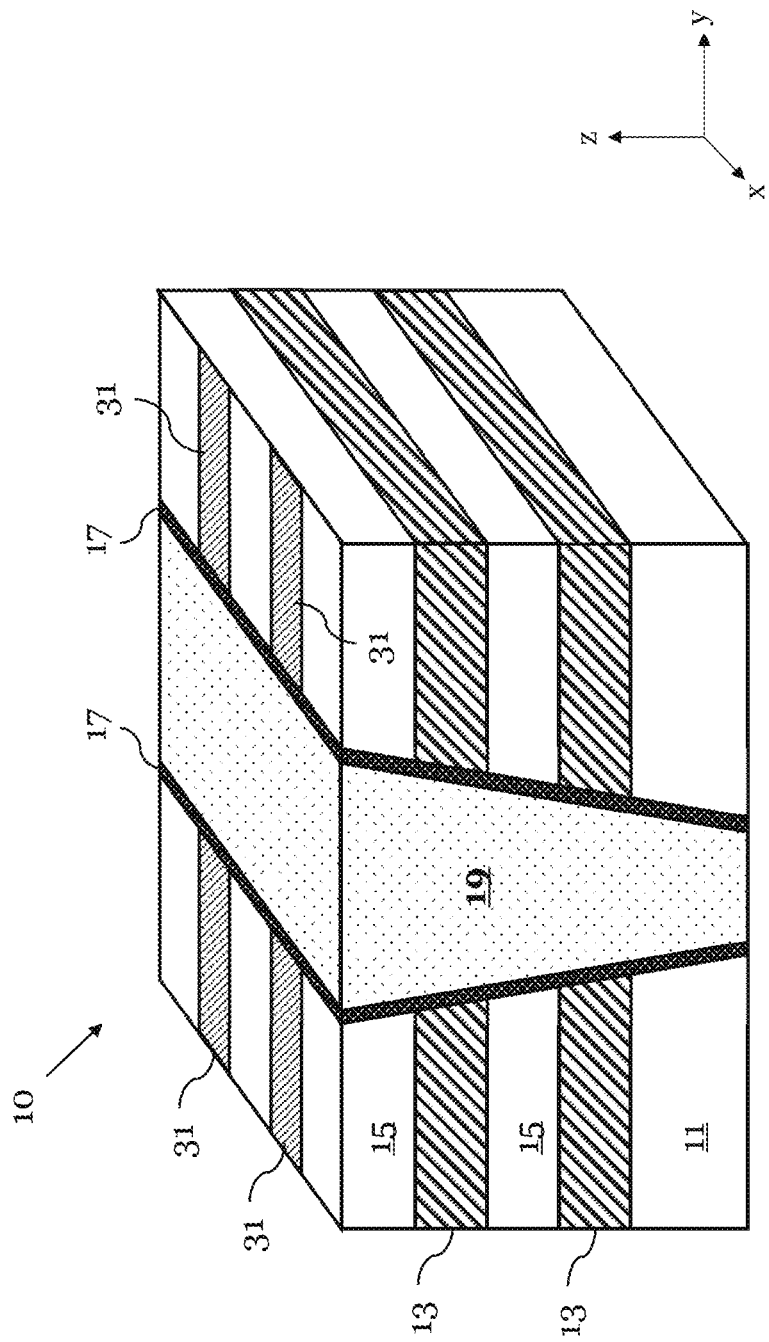
FIG. 3 shows a schematic diagram of an example memory structure according to an embodiment.

FIG. 3 shows a schematic diagram of the example memory structure 10 according to an embodiment. In particular, FIG. 3 shows a 3D perspective view of the memory structure 10.

In particular, the memory structure 10 shown in FIG. 3 can be similar to the memory structure 10 shown in FIG. 1.

In FIG. 3, the memory structure 10 in FIG. 3 comprises a plurality of conductive lines 31 which are arranged on the layer stack one after another along the length of the trench, wherein each conductive line extends perpendicular to an extension direction of the trench (in FIG. 3 along the x-direction).

Thereby, each conductive line 31 can form a bit line of the memory structure 10. In this example, the conductive material layers 13 of the layer stack can form word lines of the memory structure 10.

The conductive lines 31 can be formed from a metallic or doped semiconductor material, e.g., doped polysilicon.

As shown in FIG. 3, the oxide semiconductor layer 19 in the trench can extend (e.g., uninterrupted) between at least two adjacent conductive lines 31. In some examples, the oxide semiconductor layer 19 can extend (e.g., uninterrupted) between all conductive lines 31 of the memory structure 10.

In various instances, the lower conductivity of oxide semiconductor and that it may be only conductive in the vicinity of a (positive) voltage, can reduce and/or prevent short circuiting between different bit lines. For example, the oxide semiconductor layer 19 can act as an insulator between different gate-controlled channel areas, in contrast to a doped polysilicon channel which can cause short circuiting.

In various implementations, no interruption of the oxide semiconductor layer 19 between the individual bit lines is required. Such an interruption of the oxide semiconductor layer 19 can require a difficult high aspect ratio etch of the channel layer in the trench.

Further, avoiding a patterning of the channel layer can allow for larger memory density, e.g., up to twice the density compared to a structured channel can be achieved in some instances.

In some examples, making use of the lower conductivity of the oxide semiconductor layer 19 might allow to decode the array with selectivity offered from the bit line side. For example, for a selective programming one conductive material layer 13 of the layer stack (word line) can be set to 4 V, one (selected) bit line can be set to 0 V and the neighboring (non-selected) bit line to 5 V. Using the inhibit voltage of 5 V on non-selected bit lines in various examples can make programming selective without having a short circuit at the top cell (or selector) assuming the top layer of the layer stack is a dielectric material layer 15.

Figure 4:
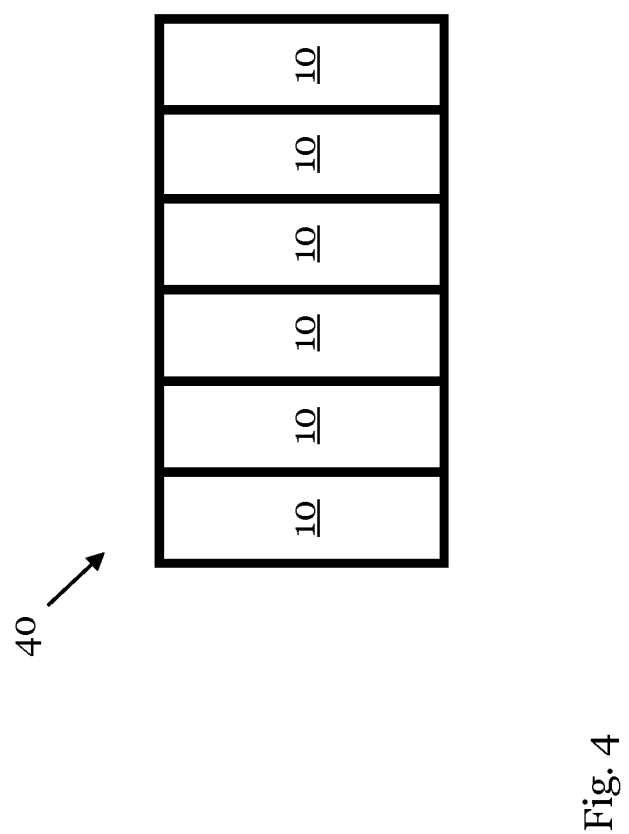
FIG. 4 shows a schematic diagram of an example flash memory according to an embodiment.

FIG. 4 shows a schematic diagram of an example flash memory 40 according to an embodiment.

The flash memory 40 can comprise one or more memory structures 10 as shown in any one of FIG. 1, 2 or 3. The flash memory 40 can be a three-dimensional NAND flash memory.

In various implementations, the high electron mobility in the oxide semiconductor layer 19 allows the memory structures 10 to be used in other configurations besides NAND, for example in NOR or AND memories for faster access applications.

FIGS. 5A-D show a method of processing the memory structure 10 according to an embodiment.

Figure 5A:
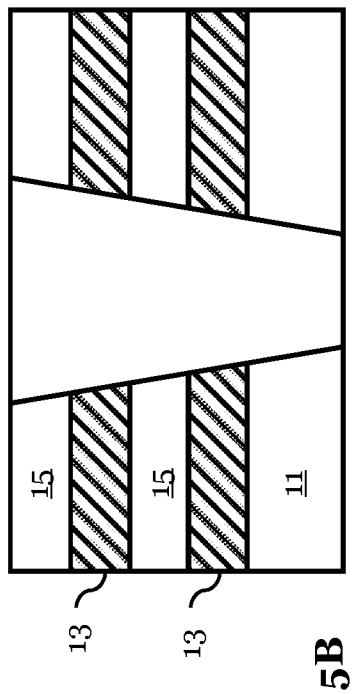
FIGS. 5A, 5B, 5C, and 5D show an example method of processing a memory structure according to an embodiment.

In the example method, shown in FIG. 5A, the substrate 11 is provided and the layer stack is formed on the surface of the substrate. The layer stack comprises the one or more conductive material layers 13 alternating with the one or more dielectric material layers 15.

The substrate can be a silicon substrate, e.g., a silicon wafer.

The layer stack can be formed by alternately depositing the conductive and the dielectric material layers 13, 15 with a suitable deposition technique, e.g., chemical vapor deposition (CVD), plasma enhanced chemical vapor deposition (PECVD), or molecular beam epitaxy (MBE).

Figure 5B:
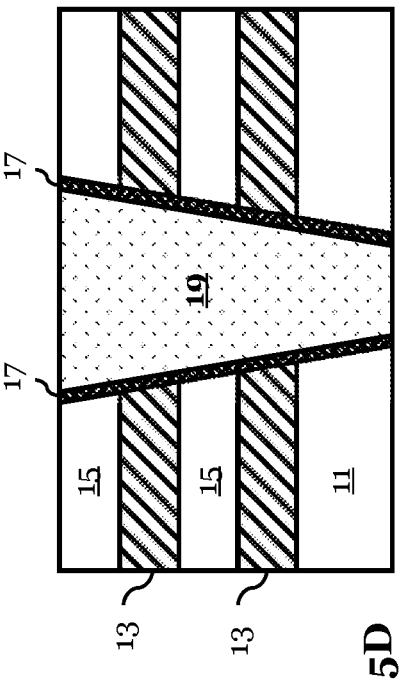

In the example method, shown in FIG. 5B, the trench is formed in the layer stack, wherein the trench is formed through (e.g., penetrates or completely penetrates) the one or more conductive material layers 13 of the layer stack, and wherein the trench comprises inner side walls.

The trench can be formed with suitable an isotropic or anisotropic wet or dry etching technique. In some examples, the trench is V-shaped and has a trapezoidal or triangular cross section.

Figure 5C:
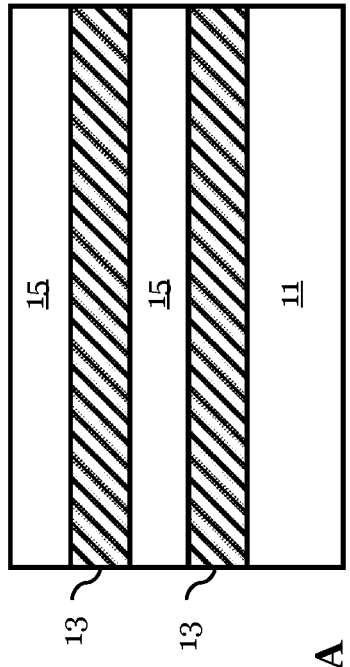

In the example method, shown in FIG. 5C, the programmable material layer 17 is formed in the trench, wherein the programmable material layer 17 covers the inner side walls of the trench.

In some examples, the programmable material layer 17 comprises a ferroelectric material, for example, a hafnium-based material, or a perovskite material, or a wurtzite material.

Forming the programmable material layer 17 can comprise depositing the ferroelectric material in the trench with a suitable deposition technique, e.g., CVD, PECVD, or MBE.

The crystallization of the ferroelectric can be done after deposition of the programmable material layer 17, and before the deposition of the channel 19, or after the deposition of a sacrificial layer, e.g., a protective layer, which is removed afterwards. In various implementations, no high temperature steps are performed on the device 10 after a ferroelectric phase formation of the programmable material layer 17.

Figure 5D:
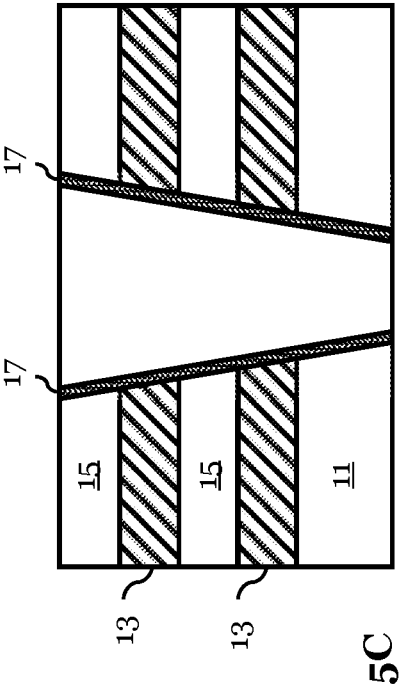

In the method, shown in FIG. 5D, the oxide semiconductor layer 19 is formed over (e.g., on top of) the programmable material layer 17. For example, the layer 19 can be formed by depositing the oxide semiconductor material on top of the programmable material layer 17 with a suitable deposition technique. The oxide semiconductor material can be formed by a physical vapor deposition (PVD) process.

In various implementations, the oxide semiconductor layer 19 can fill up the trench, as shown in FIG. 5D. This has the advantage in some instances that no further material needs to be deposited in the trench.

Alternatively, the oxide semiconductor layer 19 can be deposited as a liner in the trench and a filling material, e.g., a dielectric, can be formed over (e.g., on top of) the oxide semiconductor layer 19 in the trench (as shown in FIG. 2).

Further, a plurality of conductive lines can be formed on the layer stack, e.g., via CVD, wherein the conductive lines are arranged one after the other along the length of the trench, wherein each conductive line extends perpendicular to an extension direction of the trench. Each conductive line can form a bit line of the memory structure, wherein the oxide semiconductor layer in the trench extends (e.g., uninterrupted) between at least two adjacent conductive lines.

Although the present invention has been described herein with reference to the specific embodiments, these embodiments do not serve to limit the invention and are set forth for illustrative purposes. It will be apparent to those skilled in the art that modifications and improvements can be made without departing from the spirit and scope of the invention.

Such simple modifications and improvements of the various embodiments disclosed herein are within the scope of the disclosed technology, and the specific scope of the disclosed technology will be additionally defined by the appended claims.

In the foregoing, it will be appreciated that any feature of any one of the embodiments can be combined or substituted with any other feature of any other one of the embodiments.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number, respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or whether these features, elements and/or states are included or are to be performed in any particular embodiment.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while features are presented in a given arrangement, alternative embodiments may perform similar functionalities with different components and/or sensor topologies, and some features may be deleted, moved, added, subdivided, combined, and/or modified. Each of these features may be implemented in a variety of different ways. Any suitable combination of the elements and acts of the various embodiments described above can be combined to provide further embodiments. The various features and processes described above may be implemented independently of one another, or may be combined in various ways. All possible combinations and subcombinations of features of this disclosure are intended to fall within the scope of this disclosure.

What is claimed is:

1. A memory structure, comprising:
a substrate;
a layer stack arranged on a surface of the substrate, the layer stack comprising one or more conductive material layers alternating with one or more dielectric material layers;
a trench formed through the one or more conductive material layers and comprising inner side walls;
a programmable material layer arranged in the trench and covering the inner side walls of the trench;
an oxide semiconductor layer arranged in the trench and over the programmable material layer,
wherein the oxide semiconductor layer fills up the trench; and
a plurality of conductive lines arranged on the layer stack one after another along a length of the trench,
wherein each conductive line extends in a direction perpendicular to an extension direction of the trench,
wherein each conductive line forms a bit line of the memory structure, and
wherein the oxide semiconductor layer in the trench extends uninterrupted between at least two adjacent conductive lines.

2. The memory structure of claim 1, wherein the trench is formed completely through the one or more conductive material layers and partly into the substrate.

3. The memory structure of claim 1, wherein the oxide semiconductor layer comprises one or more of the following materials: indium gallium zinc oxide, indium tin oxide, or indium zinc oxide.

4. The memory structure of claim 1, wherein the programmable material layer comprises a ferroelectric material.

5. The memory structure of claim 4, wherein the ferroelectric material comprises a hafnium-based material, or a perovskite material, or a wurtzite material.

6. The memory structure of claim 1, wherein the trench is V-shaped and has a trapezoidal or triangular cross section.

7. A flash memory, comprising one or more memory structures each according to the memory structure of claim 1.

8. The flash memory of claim 7, where the flash memory is a three-dimensional NAND flash memory.

9. A method of processing a memory structure, the method comprising:
 providing a substrate;
 forming a layer stack on a surface of the substrate, the layer stack comprising one or more conductive material layers alternating with one or more dielectric material layers;
 forming a trench through the one or more conductive material layers, wherein the trench comprises inner side walls;
 forming a programmable material layer in the trench, the programmable material layer covering the inner side walls of the trench;
 forming an oxide semiconductor layer in the trench and over the programmable material layer, wherein the oxide semiconductor layer fills up the trench; and
 forming a plurality of conductive lines which are arranged on the layer stack one after another along the length of the trench,
 wherein each conductive line extends in a direction perpendicular to an extension direction of the trench,
 wherein each conductive line forms a bit line of the memory structure, and
 wherein the oxide semiconductor layer in the trench extends uninterrupted between at least two adjacent conductive lines.

10. The method of claim 9, wherein the programmable material layer comprises a ferroelectric material.

11. The method of claim 10, wherein the ferroelectric material comprises a hafnium-based material, or a perovskite material, or a wurtzite material.

12. The method of claim 11, wherein forming the programmable material layer comprises depositing the ferroelectric material in the trench.

13. The method of claim 9, wherein the trench is formed completely through the one or more conductive material layers and partly into the substrate.

14. The method of claim 9, wherein the oxide semiconductor layer comprises one or more of the following materials: indium gallium zinc oxide, indium tin oxide, or indium zinc oxide.

15. The method of claim 9, wherein the trench is V-shaped and has a trapezoidal or triangular cross section.

* * * * *